(12) United States Patent
Heiba et al.

(10) Patent No.: US 10,014,462 B2
(45) Date of Patent: Jul. 3, 2018

(54) PIEZOELECTRIC NANOELECTROMECHANICAL RELAYS

(71) Applicant: Carnegie Mellon University, Pittsburgh, PA (US)

(72) Inventors: Usama Zaghloul Heiba, Pittsburgh, PA (US); Gianluca Piazza, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 273 days.

(21) Appl. No.: 15/003,027

(22) Filed: Jan. 21, 2016

(65) Prior Publication Data

US 2017/0098757 A1    Apr. 6, 2017

Related U.S. Application Data

(60) Provisional application No. 62/125,477, filed on Jan. 22, 2015.

(51) Int. Cl.
| | |
|---|---|
| *H01L 41/09* | (2006.01) |
| *H01L 41/047* | (2006.01) |
| *H01L 41/18* | (2006.01) |
| *H01L 41/332* | (2013.01) |
| *H01L 41/29* | (2013.01) |
| *H01H 57/00* | (2006.01) |

(52) U.S. Cl.
CPC ......... *H01L 41/0933* (2013.01); *H01H 57/00* (2013.01); *H01L 41/047* (2013.01); *H01L 41/18* (2013.01); *H01L 41/29* (2013.01); *H01L 41/332* (2013.01); *H01H 2057/006* (2013.01)

(58) Field of Classification Search
CPC ... H01L 41/0933; H01L 41/047; H01L 41/18; H01L 41/29; H01L 41/332; H01H 57/00
USPC ........................................ 310/328, 330, 331
See application file for complete search history.

(56) References Cited

U.S. PATENT DOCUMENTS

| | | | | |
|---|---|---|---|---|
| 6,753,582 B2 * | 6/2004 | Ma | ........................ | H01H 1/0036 257/415 |
| 8,116,011 B2 * | 2/2012 | Bolis | ........................ | G02B 3/14 359/665 |
| 8,552,621 B2 | 10/2013 | Piazza et al. | | |
| 8,604,670 B2 | 12/2013 | Mahameed et al. | | |
| 2005/0194867 A1 * | 9/2005 | Kawakubo | ............... | H01G 7/06 310/348 |
| 2006/0067840 A1 * | 3/2006 | Kawakubo | ............... | H01G 5/16 417/413.2 |

(Continued)

*Primary Examiner* — Thomas Dougherty
(74) *Attorney, Agent, or Firm* — Fish & Richardson P.C.

(57) ABSTRACT

An apparatus comprises: a body terminal comprising a first body electrode and a second body electrode; a gate terminal comprising a first gate electrode and a second gate electrode; a first actuator between the first body electrode and the first gate electrode, the first actuator comprising a first piezoelectric material; a second actuator between the second body electrode and the second gate electrode, the second actuator comprising a second piezoelectric material; a beam comprising a first end attached to the first actuator, a second end attached to the second actuator, and a suspended section between the first end and the second end; a metal channel attached to the suspended section of the beam; a source terminal extending over the beam; and a drain terminal extending over the beam.

10 Claims, 6 Drawing Sheets

(56) References Cited

U.S. PATENT DOCUMENTS

2011/0074248 A1* 3/2011 Hishinuma ............. H01G 5/16
  310/330
2011/0148255 A1* 6/2011 Nihei .................... H01H 57/00
  310/330

* cited by examiner

PIEZOELECTRIC NANOELECTROMECHANICAL RELAYS

CROSS-REFERENCE TO RELATED APPLICATIONS

This application claims the benefit of priority under 35 U.S.C. § 119(e) to provisional U.S. Patent Application No. 62/125,477 filed on Jan. 22, 2015, the entire contents of which are hereby incorporated by reference.

STATEMENT REGARDING FEDERALLY SPONSORED RESEARCH

The techniques described herein were made with government support under National Science Foundation grants CMMI-1334241 and CMMI-1334572 and DARPA NEMS award 27802. The government has certain rights in these techniques.

BACKGROUND

The present disclosure relates to the design and synthesis of piezoelectric nanoelectromechanical (NEMS) relays. NEMS relays are an implementation of a mechanical transistor that can be used to build digital logic circuits and memories.

A metal-oxide-semiconductor field-effect transistor (MOSFET) is a transistor used for switching or amplifying electronic signals. The MOSFET is a common transistor in both digital and analog circuits. Over the past decades, the MOSFET has continually been scaled down in size; typical MOSFET channel lengths were once several micrometers, but modern integrated circuits are incorporating MOSFETs with channel lengths of tens of nanometers. Smaller MOSFETs are desirable for several reasons. The main reason to make transistors smaller is to pack more and more devices in a given chip area. This results in a chip with the same functionality in a smaller area, or chips with more functionality in the same area. Since fabrication costs for a semiconductor wafer are relatively fixed, the cost per integrated circuits is mainly related to the number of chips that can be produced per wafer. Hence, smaller ICs allow more chips per wafer, reducing the price per chip. However, the restrictions on further scaling of MOSFETs have propelled an interest in investigating different switching technologies for computational logic and memory applications.

SUMMARY

This present disclosure describes systems and methods for designing, fabricating and using piezoelectric nanoelectromechanical (NEMS) relays. Buckling-based NEMS relays may be formed by a single material, for example, aluminum nitride (AlN), and by locating the piezoelectric actuators at the anchors (outside the moving structure). This switching technology employs the generated stress from the anchored piezoelectric actuators to buckle a clamped-clamped beam to connect the source and drain. The residual stress set in the clamped-clamped beam during the deposition process is used to control the actuation voltage. This technique exploits residual stress to deliver a highly scalable switching mechanism that may exhibit low actuation voltage and fast switching, and may achieve an equivalent electric body bias via mechanical methods. Furthermore, the described switching technology may eliminate the dependence of the switching voltage on the actuator footprint, which may hinder further miniaturization of NEMS relays.

In one aspect, an apparatus includes a body terminal comprising a first body electrode and a second body electrode; a gate terminal comprising a first gate electrode and a second gate electrode; a first actuator between the first body electrode and the first gate electrode, the first actuator comprising a first piezoelectric material; a second actuator between the second body electrode and the second gate electrode, the second actuator comprising a second piezoelectric material; a beam comprising a first end attached to the first actuator, a second end attached to the second actuator, and a suspended section between the first end and the second end; a metal channel attached to the suspended section of the beam; a source terminal extending over the beam; and a drain terminal extending over the beam, wherein the first actuator and the second actuator are each configured to generate piezoelectric stress when an actuation voltage is applied between the body terminal and the gate terminal, and wherein the beam is configured for one or more structural modifications in response to the piezoelectric stress to modify one or more distances from the metal channel to the source terminal and the drain terminal.

Implementations of the disclosure can include one or more of the following features. Each of the first body electrode, the second body electrode, the first gate electrode, and the second gate electrode may include a conductive material. The beam may include a single layer of a third piezoelectric material. Each of the first, second, and third piezoelectric materials may include one or more of aluminum nitride (AlN), a lead titanate compound, lead zirconate titanate (PZT), lead magnesium niobate-lead titanate (PMNT), zinc oxide (ZnO), lithium niobate (LiNbO3), lithium tantalate (LiTaO3), gallium arsenide (GaAs), gallium nitride (GaN), a III-V compound, or a II-VI compound. The beam may be configured for buckling towards the source terminal and the drain terminal to decrease the one or more distances from the metal channel to the source terminal and the drain terminal to form a conductive channel through the metal channel between the source terminal and the drain terminal. The beam may be configured for buckling away from the source terminal and the drain terminal to increase the one or more distances from the metal channel to the source terminal and the drain terminal to remove a conductive channel formed through the metal channel between the source terminal and the drain terminal. The beam may have a residual stress that at least partly determines a value of the actuation voltage required to modify the one or more distances from the metal channel to the source terminal and the drain terminal. The beam may have a length that at least partly determines a value of the actuation voltage required to modify the one or more distances from the metal channel to the source terminal and the drain terminal. The beam may have a thickness that at least partly determines a value of the actuation voltage required to modify the one or more distances from the metal channel to the source terminal and the drain terminal.

In another aspect of the present disclosure, a method includes forming a first body electrode and a second body electrode on a surface of a substrate; depositing a piezoelectric film on the first body electrode, the second body electrode, and an exposed portion of the substrate between the first body electrode and the second body electrode; forming a first gate electrode, a second gate electrode, and a metal channel on the piezoelectric film; etching the piezoelectric film to form a beam; forming a source terminal and a drain terminal; and removing the substrate under the beam to suspend the beam with respect to the substrate.

Implementations of the disclosure can include one or more of the following features. Forming the first body electrode and the second body electrode may include depositing a platinum layer having a thickness of approximately 8 nanometers on a titanium adhesion layer having a thickness of approximately 2 nanometers, and patterning the platinum layer to form the first body electrode and the second body electrode. Depositing the piezoelectric film may include depositing a first layer having a thickness of approximately 10% of the piezoelectric film at a first flow rate, depositing a second layer having a thickness of approximately 10% of the piezoelectric film at a second flow rate that is less than the first flow rate, depositing a third layer having a thickness of approximately 40% of the piezoelectric film at a third flow rate that is less than the second flow rate, and depositing a fourth layer having a thickness of approximately 40% of the piezoelectric film at a fourth flow rate that is less than the third flow rate. The piezoelectric film may have a thickness of approximately 100 nanometers and a compressive stress of approximately 10 MPa. Forming the first gate electrode, the second gate electrode, and the metal channel may include depositing a platinum layer on the piezoelectric film; and patterning the platinum layer to form the first gate electrode, the second gate electrode, and the metal channel. Forming the source terminal and the drain terminal may include depositing a sacrificial layer of amorphous silicon having a thickness of 80 nanometers on the metal channel; depositing a platinum layer having a thickness of 400 nanometers on the sacrificial layer; patterning the platinum layer to form the source terminal and the drain terminal; and removing the sacrificial layer of amorphous silicon.

In yet another aspect of the present disclosure, an apparatus includes a body terminal comprising a first body electrode and a second body electrode, with each of the first body electrode and the second body electrode comprising platinum; a gate terminal comprising a first gate electrode and a second gate electrode, with each of the first gate electrode and the second gate electrode comprising platinum; a first actuator between the first body electrode and the first gate electrode, the first actuator comprising aluminum nitride; a second actuator between the second body electrode and the second gate electrode, the second actuator comprising aluminum nitride; a beam comprising a first end attached to the first actuator, a second end attached to the second actuator, and a suspended section between the first end and the second end, with the beam comprising aluminum nitride; a metal channel attached to the suspended section of the beam, with the metal channel comprising platinum; a source terminal extending over the beam at a first distance of approximately 70 nm from the beam, with the source terminal comprising platinum; and a drain terminal extending over the beam at a second distance of approximately 70 nm from the beam, with the drain terminal comprising platinum, wherein the first actuator and the second actuator are each configured to generate piezoelectric stress when an actuation voltage is applied between the body terminal and the gate terminal, and wherein the beam is configured for one or more structural modifications in response to the piezoelectric stress to modify the first distance from the metal channel to the source terminal and the second distance from the metal channel to the drain terminal.

DETAILED DESCRIPTION

Figure 1:
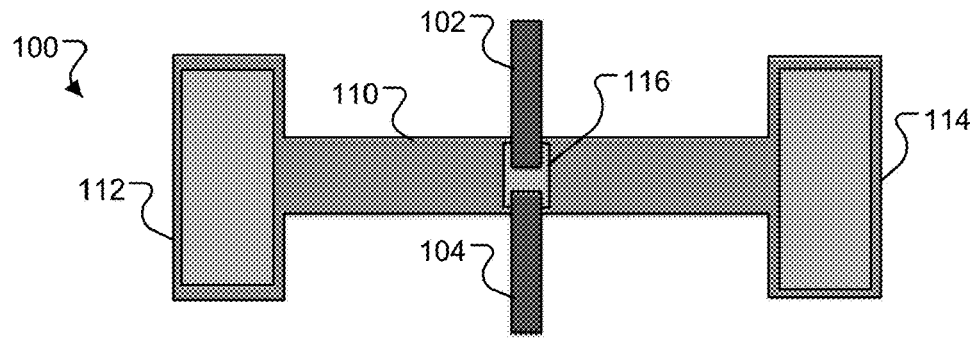
FIG. 1 is a top view of an example of a NEMS relay.
Figure 2:
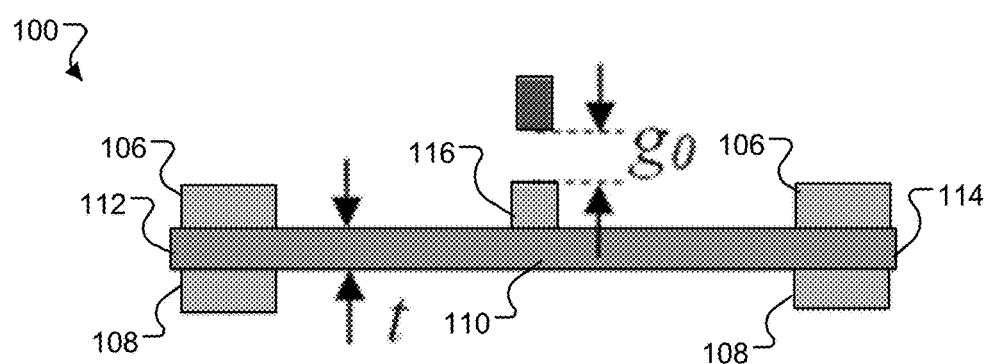
FIG. 2 is a side view of the NEMS relay in a first state.
Figure 3:
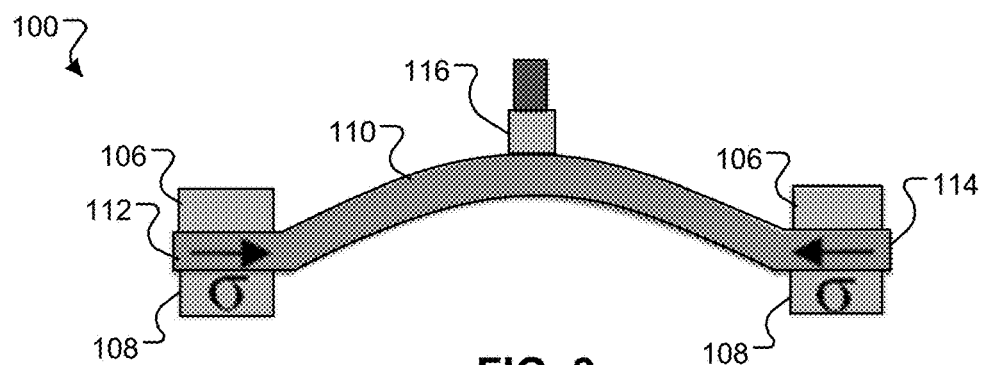
FIG. 3 is a side view of the NEMS relay in a second state.

FIGS. 1-3 shows an example of a NEMS relay 100. The relay 100 includes a source terminal 102, a drain terminal 104, a gate terminal including gate electrodes 106, and a body terminal including body electrodes 108. The relay 100 includes a suspended beam 110 that can be composed of aluminum nitride (AlN). The suspended beam 110 is attached on both sides to anchored piezoelectric actuators 112 and 114. The actuators 112 and 114 may be composed of a piezoelectric AlN film sandwiched between the gate electrodes 106 and the body electrodes 108, which are used to apply an electric field across the piezoelectric actuators 112 and 114. The beam 110 carries a metal channel 116 at its central section to form a conductive channel between the source terminal 102 and the drain terminal 104, which extend over and are located transversely to the beam.

The suspended beam 110 and the anchored actuators 112 and 114 of the relay 100 may be fabricated using any piezoelectric material. For example, aluminum nitride (AlN), a lead titanate compound, lead zirconate titanate (PZT), lead magnesium niobate-lead titanate (PMNT), zinc oxide (ZnO), lithium niobate (LiNbO3), lithium tantalate (LiTaO3), gallium arsenide (GaAs), gallium nitride (GaN), a III-V compound, a II-VI compound, or any compound that exhibits piezoelectricity. The gate electrodes 106 and the body electrodes 108 that sandwich the actuators 112 and 114 as well as the contact pairs of the relay 100 can be formed by any metal or conductive thin films (e. g. doped polysilicon, silicon, graphene, etc.).

Fabricating the beam 110 and the actuators 112 and 114 may include the synthesis of thin and highly c-axis oriented piezoelectric aluminum nitride (AlN) films with controlled in-plane stress and stress gradient over ultrathin seed layers. Fabricating the relay 100 may include the synthesis of well-textured ultrathin Ti/Pt layers for the body electrodes 108, (ii) the synthesis of thin highly c-axis oriented piezoelectric AlN films for the beam 110 and the actuators 112 and 114 over the ultrathin Pt layers of the body electrodes 108, and (iii) the precise control of the in-plane residual stress and stress gradient of the AlN films of the beam 110 and the actuators 112 and 114, which determine the switching voltage and the beam buckling direction, respectively.

If the longitudinal stress in the beam 110 (in x-direction) is slightly compressive or tensile, the resulting beam central z-deflection, d, is very small and the switch remains in the off state (e.g., as shown in FIG. 2). Once the stress exceeds the critical value given by $$\sigma_{crit} = \frac{E\pi^2}{3}\left(\frac{t}{L}\right)^2 \quad (1)$$

where E, t, and L are the elastic modulus, thickness, and length of the beam 110, respectively, the beam 110 buckles (as shown in FIG. 3) and the deflection increases remarkably. If d is larger than the switching gap, $g_0$, the metal channel 116 connects the source terminal 102 and the drain terminal 104, turning the relay to the on state (e.g., as shown in FIG. 3).

The central deflection, d, can be calculated using $$d = \frac{2L}{\pi}\left(\frac{\sigma}{E} - \frac{\pi^2}{3}\left(\frac{t}{L}\right)^2\right)^{1/2} \quad (2)$$

where σ is the net stress applied to the beam 110, and is given by $$\sigma = \sigma_{residual} + \sigma_{piezo} \quad (3)$$

where $\sigma_{residual}$ is the residual stress in the beam material resulting from the fabrication process, and $$\sigma_{piezo} = e_{31}\frac{V}{t}$$

is the stress generated by the anchored piezoelectric actuators 112 and 114 ($e_{31}$ is the transverse piezoelectric coefficient, and V is the applied potential across the piezoelectric film of thickness t, which coincides with the beam thickness). Based on the above analysis, the generated piezoelectric stress, which is dependent on the applied bias between the gate and body terminals, can be employed to pre-load the beam 110 and therefore control its buckling and the switching event. The initial conditions of the beam 110 determine its buckling direction. The sign of the stress gradient across the piezoelectric film thickness of the beam 110 may be controlled to result in buckling the beam 110 in the up direction towards the source terminal 102 and the drain terminal 104. The switching voltage of the relay 100 may be tuned via modifying the beam residual stress and length, and the beam film thickness.

The relay 100 may exhibit larger displacement compared to conventional unimorph actuators for a given device footprint. Therefore, the relay 100 may be driven using a lower actuation voltage, which results in a higher scalability. The relay 100 may be simpler to demonstrate and more robust against fabrication process tolerances compared to the unimorph-based relays. The displacement of the beam 110 is independent on the thicknesses and residual stresses of the gate and body electrodes 106 and 108 in the anchored piezoelectric actuators 112 and 114. Also, controlling the residual stress is required only for the suspended beam 110 (a single material) compared to the mandatory control of stress in the multi-layer stacks (composed of ultrathin films) of miniaturized unimorph relays.

In an example, the switching voltage of the buckling relays of the NEMS relay described here can be tuned via modifying the beam residual stress and length, and the AlN film thickness. This aspect of the relay is described with regard to analytical expressions (Eq. 1-3) and finite element analysis (FEA) using COMSOL 3D coupled Piezo-Solid simulations.

Figure 4A:
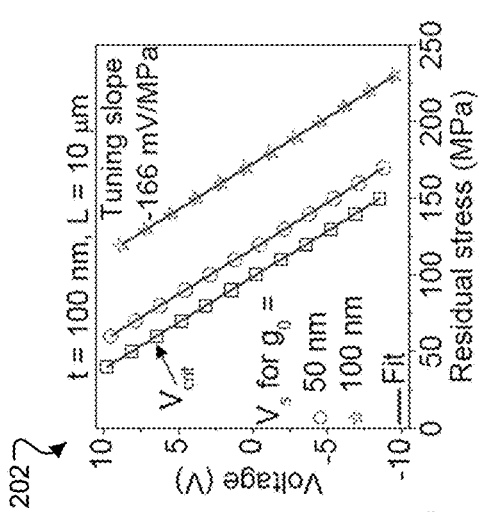
FIGS. 4a-4d are diagrams of tuning of a switching voltage via residual stress and the beam geometry.

Referring to FIG. 4a, diagram 200 presents the computed beam central deflection, d, as a function of the applied voltage across the piezoelectric film for a series of residual stress levels. A very good agreement between the analytical and FEA results is illustrated. The relatively small deviation of FEA data may be attributed to the beam width effect. It is evident from the figure that the voltage required to yield a specific deflection, hence the switching voltage, $V_s$, can be tuned by modifying the residual stress. This is a significant advantage of the buckling-based relays.

Figure 4B:
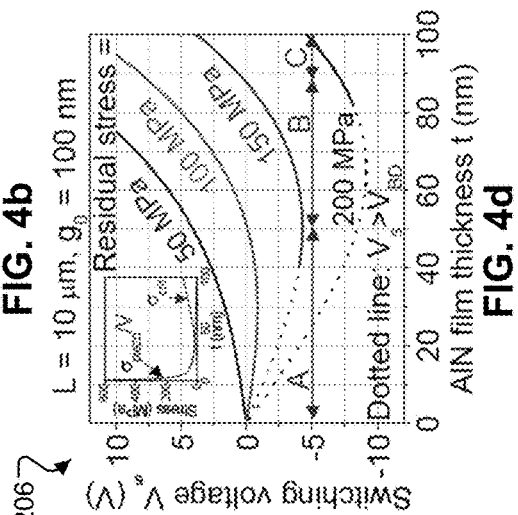

Referring to FIG. 4b, diagram 202 illustrates that the switching voltage is tuned linearly with the residual stress for different switching gaps, $g_0$. The tuning slope is independent of $g_0$, and for this particular beam geometry it is relatively small (−166 mV/MPa). The small tuning slope is a key finding considering the recently reported data on the precise control of the intrinsic stress in thin AlN films, which enables an accurate tuning of the relay switching voltage. The figure also shows that the critical voltage, $V_{crit}$ (the voltage at which buckling occurs) is linearly dependent on the residual stress. The described piezoelectric relays can be operated as a normally open 'NO' or normally closed 'NC' devices by adjusting the beam residual stress. In the NC operation, the beam deflection due to residual stress is typically larger than $g_0$, and the tensile stress generated by the anchored piezoelectric actuators can pull the beam far from the contact area, switching the relay to the off state.

Figure 4C:
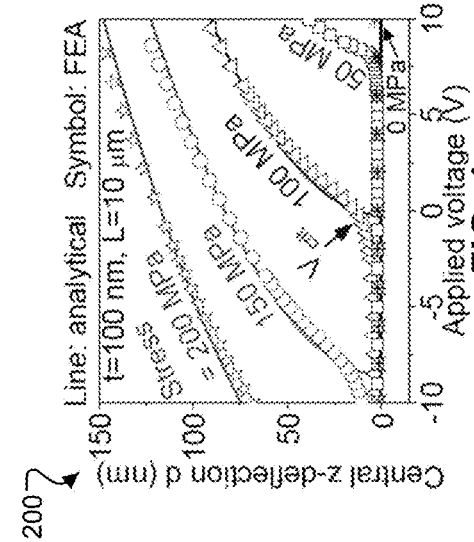

The critical load of the beam and its central deflection are dependent on the beam length, L, and the AlN film thickness, t, according to Eq. 1 and 2. As a result, for a given technology node (t, $g_0$, and residual stress), the switching voltage can be adjusted via controlling L as plotted in diagram 204 FIG. 4c. The figure also shows that both NO and NC relays can be realized simultaneously for a given technology node, just by changing L. This is a significant feature for the piezoelectric buckling relays described herein which can facilitate building highly complex digital circuits.

Figure 4D:
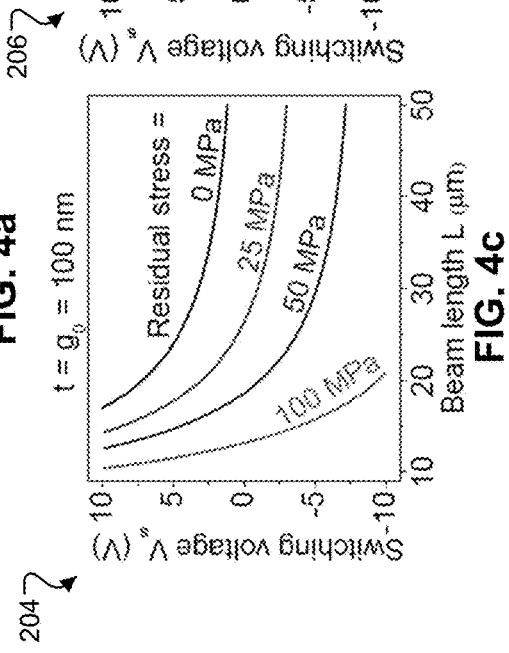

Referring to FIG. 4d, diagram 206 illustrates that modifying t can be used to tune the switching voltage and to decide on the nature of the resulting relay, whether NO or NC. At relatively small residual stress (e.g. 50 MPa), and for the entire range of t values, the beam deflection, d, is smaller than $g_0$ which results in a NO relay. $V_s$ should therefore increase with t to result in larger $\sigma_{piezo}$ than $\sigma_{crit}$, and hence further increase d. At larger stress levels (e.g. 150 MPa), the trend of $V_s$ vs. t has three scenarios marked as A, B, and C with two transition points at 50 and 88 nm. For regions A and B, the beam deflection due to residual stress is larger than $g_0$ (i.e. results in a NC relay and negative bias is required to turn the relay off), while for C, the deflection is smaller than $g_0$ (i.e. results in a NO relay). For the three regions, the trend of $V_s$ as a function of t is determined based on the evolution of $\sigma_{crit}$ the piezoelectric stress per unit voltage, $\sigma_{piezo}/V$, with t (see the figure inset in FIG. 4d). At region A, increasing t results in a much sharper decrease in $\sigma_{piezo}/V$ compared to the increase in $\sigma_{crit}$. The decrease in $\sigma_{piezo}/V$ is compensated via increasing $V_s$ with t. An opposite trend exists in region B where the decrease in $\sigma_{piezo}/V$ with t starts to saturate, while the increase in a $\sigma_{crit}$ with t becomes more remarkable. As a result, $V_s$ decreases with t to further reduce $\sigma_{piezo}$. In section C, the deflection due to residual stress is smaller than $g_0$, and $V_s$ increases with t similar to the 50 MPa case.

The NEMS relays described herein achieve miniaturization for digital logic applications. Reduced device footprint will come with lower energy consumption and faster switching. For the piezoelectric relays described herein, the design parameters which affect the scaling of the technology are the piezoelectric film thickness, t, and the switching gap height, $g_0$.

Figure 5A:
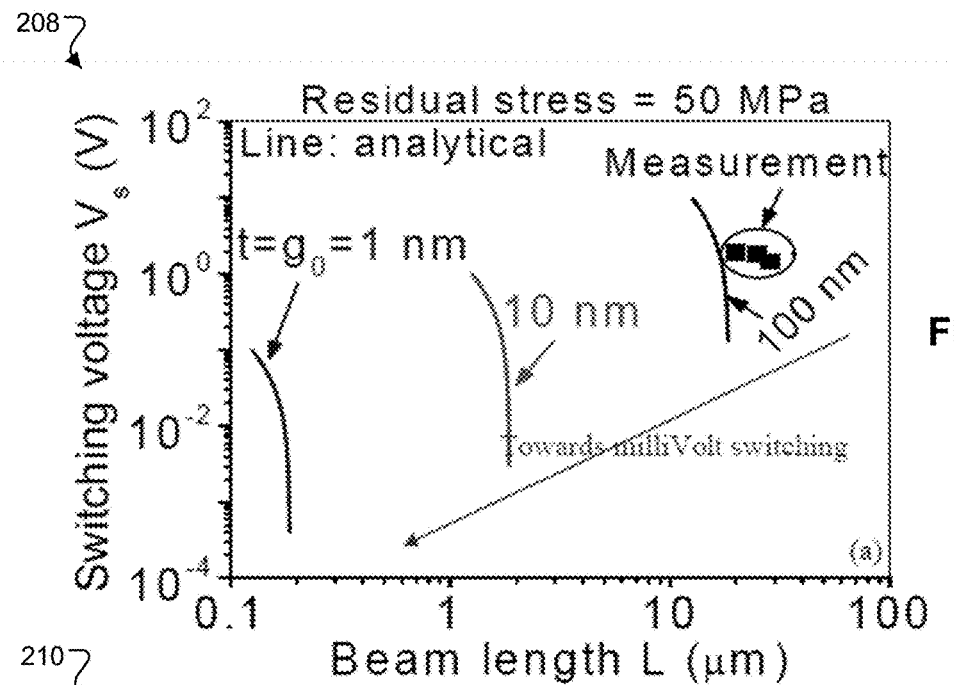
FIGS. 5a-5b are diagrams of calculated switching voltages.

Referring to FIG. 5a, diagram 208 illustrates the switching voltage calculated for different technology nodes, each identified by a specific t and $g_0$. The residual stress is also a major specification for each node, but for purposes of convenience, it is fixed at 50 MPa in this scaling analysis. The results highlight that millivolt switching at aggressively reduced relay footprint (smaller L) is achievable if t and $g_0$ are appropriately scaled. For example, for the technology node $t=g_0=1$ nm, the switching voltage can be reduced to 10 mV for L=175 nm. Considering the recently reported data on the synthesis of ultra-thin (down to 10 nm) AlN piezoelectric films with very high quality, and with future progress in thin film deposition techniques, the demonstration of millivolt switching using this technology can be envisioned. Since the generated stress and so the switching voltage is independent of the area of the anchored piezoelectric actuators, the actuators footprint can be drastically scaled to reduce the gate-body capacitance and consequently minimize the switching energy.

Figure 5B:
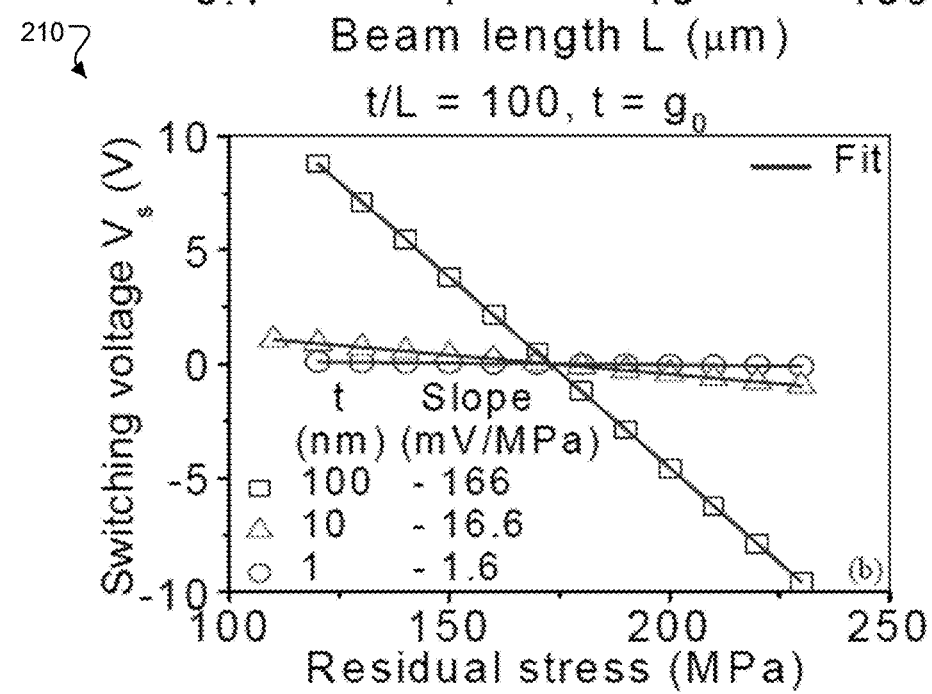

The critical and switching voltages computed as a function of the residual stress for different technology nodes are presented in diagram 210 in FIG. 5b. It is evident from the figure that the voltage vs. stress tuning slope is reduced linearly with scaling the device (t and $g_0$). This is another important feature for the described switching technology which enables a more precise control of the effect of residual stress on switching voltage with scaling. For the technology node $t=g_0=1$ nm, the tuning slope is significantly reduced to −1.6 mV/MPa, which further confirms the ability of the relays described herein to achieve millivolt switching using the buckling-based switching approach.

Figure 6:
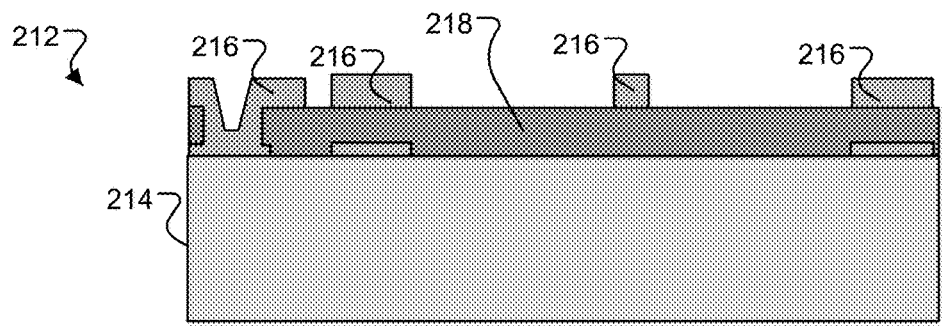
FIGS. 6-8 are side views of the NEMS relay during different stages of fabrication.
Figure 7:
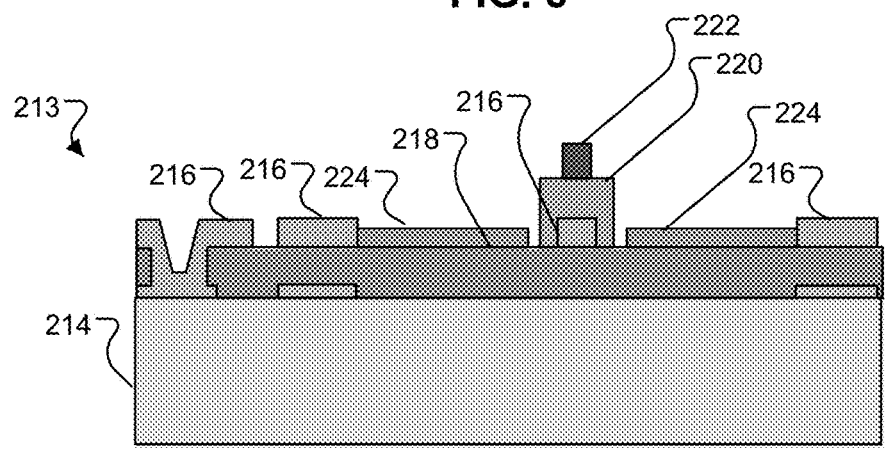
Figure 8:
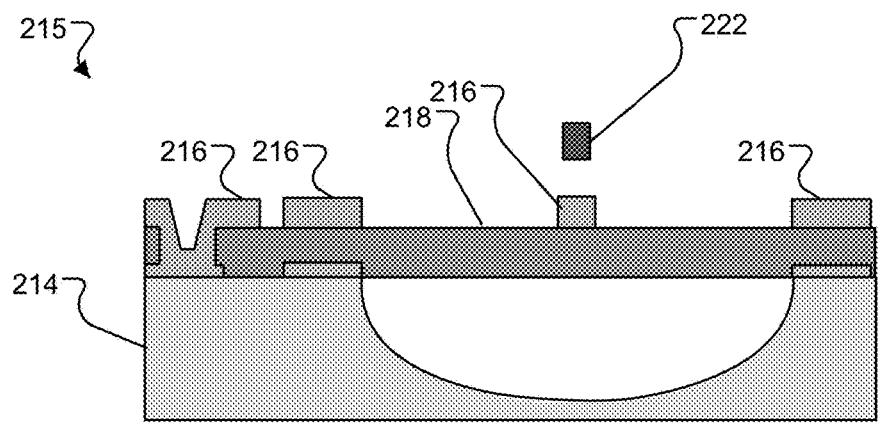

The NEMS relays fabricated in an example are based on a 100 nm thick piezoelectric AlN film, while the formed switching gap height, $g_0$, is around 70 nm. The switches were fabricated using seven photolithography masks as explained in FIGS. 6-8. Referring to FIG. 6, diagram 212 illustrates that well-textured ultra-thin Pt layers 216 (8 nm) are synthesized over adhesive Ti films (2 nm), both using dc sputtering on (100) high resistivity Si substrate 214. The Ti/Pt layers 216 were patterned by lift-off to define the bottom electrode. Then, a 100 nm thick highly c-axis oriented piezoelectric AlN film 218 with low compressive stress (~10 MPa) and controlled stress gradient was deposited by reactive sputtering over the Pt layer 216 using a four-step deposition recipe. Next, vias were opened in the AlN film 218 using AZ400K developer to access the bottom electrode. This is followed by patterning the top Pt layer 216 using lift-off, which defines the actuator's top electrode and the relay conductive channel. The lateral dimensions of the bridge are defined by dry etching of the AlN film using $Cl_2/BCl_3/Ar$ chemistry Next, a sacrificial layer 220 of amorphous Si (~80 nm) is sputtered and patterned by lift-off to define the switching gap, followed by patterning the source and drain from Pt by lift-off. Referring to FIG. 7, diagram 213 illustrates that a photoresist mask 224 is used to define small release openings around the bridge. Next, $XeF_2$ is used to etch the sacrificial layer 220 and the Si substrate 214 to release the bridge. Referring to FIG. 8, diagram 215 illustrates that the photoresist 224 is removed using plasma ashing and descumming.

The bottom electrode (Ti/Pt) has to be much thinner than the piezoelectric AlN film. This is to couple efficiently the generated stress from the piezoelectric film to the suspended beam without significant losses, and to enhance the step coverage of the thin AlN layer over a thinner electrode. A comparable thickness of the AlN and Pt films will result in a considerable bending of the piezoelectric film over Pt, which deteriorates the stress transfer to the suspended bridge.

The quality of reactively sputtered piezoelectric AlN films depends heavily on the texture and crystal orientation of the seed metal layer (in our case is Pt). So, the first step towards synthesizing highly c-axis oriented AlN films is to deposit well-textured Pt layers. It is much harder to synthesize well-textured thin metal layers as they typically exhibit worse crystallinity with less thorough columnar grains when compared to thicker films. In this example, well-textured ultrathin (8 nm) Pt layers are synthesized on very thin (2 nm) titanium (Ti) adhesion layers using DC sputtering on (100) Si wafers. The chamber pressure, the argon (Ar) flow and the sputtering power used during the Pt deposition have a considerable effect on the crystal orientation of the metal layer and the subsequently deposited AlN film.

The AlN films were deposited by AC reactive sputtering from 99.999% Al target using a dual cathode S-Gun magnetron source. A process work point on the hysteresis curve of the magnetron discharge is controlled by the partial pressures of nitrogen ($N_2$) and Ar. A four-step deposition recipe was developed, for the first time, to provide better conditions for AlN nucleation on the ultrathin Pt surface. In the first step, 10% of the required AlN thickness is deposited at higher $N_2$ flow enabling the S-Gun magnetron to operate in a "deeper poison" mode, which enhances the nucleation of small grain size. In the second step, the $N_2$ flow is reduced, which enables the magnetron discharge to stay in the center of the poison mode during which 10% of the AlN thickness is deposited. The $N_2$ flux is further reduced in the third and fourth steps to allow the magnetron discharge to operate in the poison mode yet at the work point closer to the transition area between poison and metallic modes on the hysteresis curve. The remaining 80% of the AlN film is sputtered in these two steps (40% each).

The orientation and quality of piezoelectric AlN films are normally characterized using the full width at half maximum (FWHM) of x-ray diffraction rocking curve measurements around the AlN diffraction peak (0002), with the films of better crystal orientation exhibiting smaller FWHM values. The 100 nm AlN films synthesized in this example over 8 nm thick Pt layers exhibited FWHM of 2.4°, which is comparable to the reported values for AlN films deposited on silicon substrates (Si is considered as the best seed layer for AlN sputtering and is used as a reference for comparison). This highlights the significance of the developed methods to synthesize the seed Pt layer and the piezoelectric AlN film.

The in-plane residual stresses in the AlN film as well as the stress gradient across the film thickness are controlled accurately during the third and fourth sputtering steps via reducing the Ar flow gradually. This is a critical step in the fabrication process since the resulting residual stress in the AlN beam is employed to tune the actuation voltage. Furthermore, the stress gradient across the AlN film thickness sets the initial condition of the suspended beam to assure that it buckles in the upper direction only (towards the source and drain). Simultaneously, the Ar flow was adjusted to keep the operation of the magnetron discharge in the required work point on the hysteresis curve to produce a high quality piezoelectric film. To control the in-plane stress and the stress gradient in the synthesized AlN films and at the same time obtain a highly c-axis oriented piezoelectric films via the developed deposition methods are major innovations and accomplishments of the techniques described herein The beam deflection is independent on the thicknesses of the top and bottom electrodes since the piezoelectric actuators are anchored. Therefore, the buckling-based relays are more robust against the fabrication process tolerances compared to conventional unimorph actuators where the thicknesses of theses electrodes affect the electromechanical coupling remarkably.

The source and drain are composed of relatively thick Pt layers (400 nm) to reduce the residual stress-induced deflection in the source and drain beams, and hence maintain the nanometer height switching gap after releasing the relay.

In an example, a system compares the maximum deflection of the anchored piezoelectric actuators described herein and the normal unimorph actuators. Conventional unimorph actuators are composed of a piezoelectric film attached to an elastic layer to offset the neutral axis to cause the beam bending. Also, the deflection of unimorph actuators can be maximized via optimizing several parameters. These optimization parameters are described below and then the deflection of an optimized unimorph actuator is compared to the described buckling-based actuator.

Figure 9:
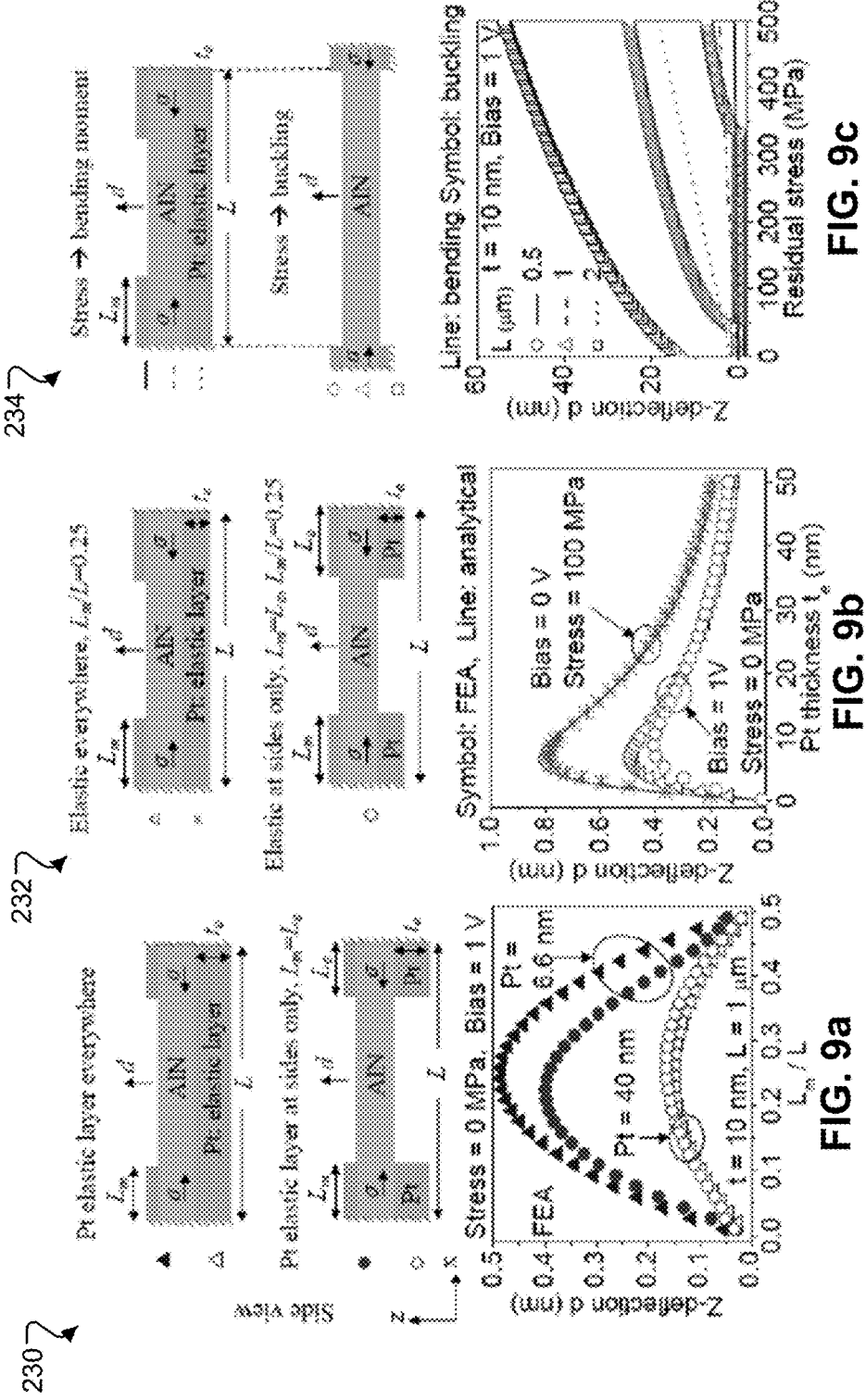
FIGS. 9a-9c are diagrams of comparisons between buckling and unimorph relays.

For the movable unimorph actuator, the beam deflection is maximized by optimizing the elastic layer coverage, electrode coverage, and the thickness of the elastic layer, $t_e$ (see diagrams 230, 232 in FIGS. 9a-9b, respectively). The coverage of the elastic and electrode layers is optimized using FEA simulations (FIG. 9a). For the first case, the elastic layer covers the entire actuator length (denoted as elastic everywhere), while for the second case the elastic layer covers the lateral sides of the actuator only (named elastic at sides only). Also, for the second case, the length of the electrode coverage, $L_m$, and the elastic layer coverage, $L_e$, are equal. The simulations were performed using Pt elastic layers of two selected thicknesses (thinner $t_e$=6.6 nm and thicker $t_e$=40 nm compared to the piezoelectric film thickness, t), and the results are shown in FIG. 8a. It is obvious that the maximum central z-deflection is obtained when $L_m/L$ equals 0.25 (i.e. when the electrodes cover the outer quarters of the suspended actuator), independently of the elastic layer thickness and coverage length. Also, the influence of the elastic layer coverage on deflection is dependent on its thickness.

The influence of $t_e$ was optimized, e.g., using the DeVoe-Pisano model and other methods. The results also were confirmed by FEA (FIG. 9b). Assuming that the elastic and piezoelectric layers have the same width, the deflection due to transferring the generated piezoelectric strain (resulting from an applied potential V across the piezoelectric film) to a bending moment is given by $$d = \frac{3L^2 t_e (t_e + t) E_e E d_{31} V}{E_e^2 t_e^4 + E_e E(4t_e^3 t + 6t_e^2 t^2 + 4t_e t^3) + E^2 t^4} \quad (4)$$

where $t_e$ and $E_e$ are the thickness and elastic modulus of the elastic layer, while t and E are the thickness and the elastic modulus of the piezoelectric film. The deflection as a function of $t_e$ under applied bias of 1 V and for a full- and partial coverage of the elastic layer is plotted in FIG. 9. For this analysis, the optimum electrode coverage ($L_m/L$=0.25) was used. In this example, there is an optimum $t_e$ at which the electromechanical coupling and so the deflection is maximum, for both full and partial-coverage of the elastic layer. For the full elastic layer coverage case, and for a Pt elastic layer, the optimum $t_e$ is 6.6 nm for a 10 nm thick piezoelectric AlN film. In this example, the maximum deflection is obtained when the elastic layer covers the whole actuator length.

Following an analogous analysis to a piezoelectric actuation model, and by substituting the axial forces generated by the piezoelectric effect by forces due to residual stress in the piezoelectric film, the central z-deflection due to residual stress can be calculated using $$d = \frac{3L^2 t_e t(t_e + t) E_e \sigma_{residual}}{E_e^2 t_e^4 + E_e E(4t_e^3 t + 6t_e^2 t^2 + 4t_e t^3) + E^2 t^4} \quad (5)$$

Where $\sigma_{residual}$ is the residual stress in the piezoelectric film (in this example, there is zero residual stress in the elastic layer). The deflection obtained for different $t_e$ under the influence of residual stress only (bias=0 V) is plotted also in FIG. 9b. The developed equation shows a very good agreement with the FEA results, and both confirm that the optimum $t_e$ is 6.6 nm, similar to what is obtained for the piezoelectric generated strain. In view of this analysis, the maximum deflection of conventional unimorph actuator can be obtained when the elastic layer covers the whole actuator length, the electrodes cover the outer L/4 of the beam, and finally the thickness of the elastic layer is optimized.

Referring to FIG. 9c, diagram 234 shows the maximum deflection of both actuation schemes (the optimized conventional unimorph actuator and the buckling-based actuation) under different residual stress levels and at an applied bias of 1 V. Both actuators have the same piezoelectric film thickness, t, and effective movable length, L. In this example, the buckling-based topology results in much larger deflection than the movable actuators (deflection due to bending moment). For example, for L=1 μm and 100 MPa stress, the deflection obtained from buckling is approximately 7 times higher than the displacement caused by rotation. This emphasizes that the switching via buckling can lead to more scaled device footprints, reduced switching voltage, and hence much smaller switching energy. For L=10 μm, the deflection form buckling is found to be slightly larger than the rotation (~140% at 100 MPa). Considering the much larger difference in deflection between both actuation mechanisms for much smaller L (e.g. 1 μm) as shown in FIG. 9c, the scaling of the buckling-based relays is more advantageous than conventional piezoelectric actuators, based on the abovementioned equations, where scaling L reduces the deflection quadratically for unimorph actuators (from Eq. 4: d $\alpha$ $L^2$) and linearly for buckled-based actuators (from Eq. 2: d $\alpha$ L). Therefore, the switching via buckling can lead to highly miniaturized relays, reduced switching voltage, and hence much smaller switching energy.

This comparison is validated via fabricating piezoelectric NEMS relays which use optimized unimorph actuators on the same wafer of buckling-based relays. Both devices were made of 100 nm thick AlN films and had the same effective movable length, L=25 um. The optimum thickness of the elastic layer (top Pt) was used (~60 nm), while the elastic layer and the bottom electrode were located at the outer sides only and covered L/4 of the movable beam. A full coverage of the elastic layer on the beam was not possible due to the incompatibility with the buckling-based relays. At 10 MPa residual stress (the measured stress in the AlN film of this work) and an applied potential of 10 V, the calculated deflections of a buckling-based actuator and a fully optimized unimorph actuators are 215 and 35 nm, respectively as shown in FIG. 9b. This difference is in accordance with the deflection ratio of miniaturized relays at t=10 nm. Practically, the deflection of the realized unimorph actuators is smaller than the maximum calculated deflection (35 nm) due to the effect of the bottom Pt electrode (neglected in this analysis) and the partial coverage of the elastic layer on the beam. Furthermore, the influence of the residual stress in the elastic layer was not considered. The unimorph-based relays are not actuated even at 10 V applied bias (close to the breakdown voltage of 100 nm thick AlN film) due to the smaller beam deflection compared to the switching gap (~70 nm) A switching voltage of 21 V is required to turn the unimorph-based relay to the on state, which can be reduced via a substantial increase in the device footprint. This highlights the significance of buckling-based relays on reducing the switching voltage (driven at ~1.8 V only), and therefore on the technology scaling.

Figure 10:
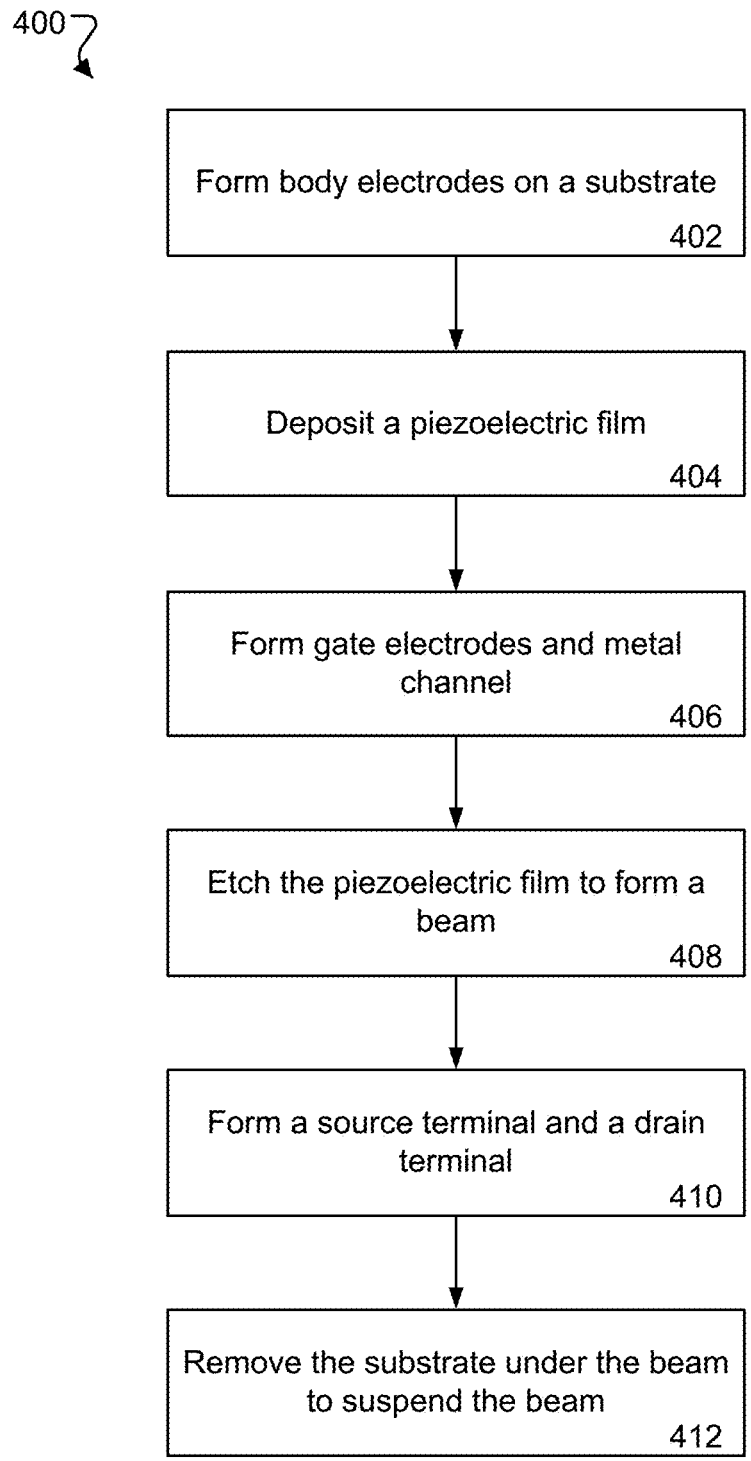
FIG. 10 is a flowchart of an example of a process for forming the NEMS relay.

Referring to FIG. 10, process 400 is implemented for forming the NEMS relay. In operation, a system (such as a fabrication device) forms (402) a first body electrode and a second body electrode on a surface of a substrate. The system deposits (404) a piezoelectric film on the first body electrode, the second body electrode, and an exposed portion of the substrate between the first body electrode and the second body electrode. The system forms (406) a first gate electrode, a second gate electrode, and a metal channel on the piezoelectric film. The system etches (408) the piezoelectric film to form a beam. The system forms (410) a source terminal and a drain terminal. The system removes (412) the substrate under the beam to suspend the beam with respect to the substrate.

In an example, forming the first body electrode and the second body electrode comprises: depositing a platinum layer having a thickness of approximately 8 nanometers on a titanium adhesion layer having a thickness of approximately 2 nanometers; and patterning the platinum layer to form the first body electrode and the second body electrode. In another example, depositing the piezoelectric film comprises: depositing a first layer having a thickness of approximately 10% of the piezoelectric film at a first flow rate; depositing a second layer having a thickness of approximately 10% of the piezoelectric film at a second flow rate that is less than the first flow rate; depositing a third layer having a thickness of approximately 40% of the piezoelectric film at a third flow rate that is less than the second flow rate; and depositing a fourth layer having a thickness of approximately 40% of the piezoelectric film at a fourth flow rate that is less than the third flow rate. In this example, the piezoelectric film has a thickness of approximately 100 nanometers and a compressive stress of approximately 10 MPa.

In another example, forming the first gate electrode, the second gate electrode, and the metal channel comprises: depositing a platinum layer on the piezoelectric film; and patterning the platinum layer to form the first gate electrode, the second gate electrode, and the metal channel. Forming the source terminal and the drain terminal comprises: depositing a sacrificial layer of amorphous silicon having a thickness of 80 nanometers on the metal channel; depositing a platinum layer having a thickness of 400 nanometers on the sacrificial layer; patterning the platinum layer to form the source terminal and the drain terminal; and removing the sacrificial layer of amorphous silicon.

Devices fabricated according to the design principles and fabrication methods described herein could be used in a variety of applications in addition to use as interconnects for MOSFETs. For example, without limiting the generality of the techniques described herein nor its range of applications, the described devices could be used to provide computation in harsh environments (temperature and radiation resistant), beyond the capability of MOSFETs. Further, they can be integrated with MOSFETs to enhance the switching and memory performance.

The techniques described herein have been described in accordance with several examples, which are intended to be illustrative in all aspects rather than restrictive. Thus, the techniques described herein are capable of many variations in detailed implementation, which may be derived from the description herein by a person of ordinary skill in the art. For example, without limiting the generality of the forgoing, the suspended beam and the anchored actuators of the buckling relays can be fabricated using any other piezoelectric material. For example, PZT, PMNT or other lead titanate compound, ZnO, $LiNbO_3$, $LiTaO_3$, GaAs, GaN and any other III-V or II-VI compound that exhibits piezoelectricity can be used instead of AlN. Also, the electrode layers that sandwich the actuators as well as the contact pairs of the relay can be formed by any metal or conductive thin films (e.g. doped polysilicon, silicon, graphene, etc.). Additionally, without limiting the generality of the forgoing, the techniques described herein are generally applicable to devices and materials of various dimensions (e.g., thickness), in addition to the ones described herein.

A number of implementations have been described. Nevertheless, various modifications can be made without departing from the spirit and scope of the processes and techniques described herein. In addition, the processes depicted in the figures do not require the particular order shown, or sequential order, to achieve desirable results. In addition, other steps can be provided, or steps can be eliminated, from the described processes, and other components can be added to, or removed from, the describe apparatus and systems. Accordingly, other embodiments are within the scope of the following claims.

What is claimed is:

1. An apparatus, comprising:
a body terminal comprising a first body electrode and a second body electrode;
a gate terminal comprising a first gate electrode and a second gate electrode;
a first actuator between the first body electrode and the first gate electrode, the first actuator comprising a first piezoelectric material;
a second actuator between the second body electrode and the second gate electrode, the second actuator comprising a second piezoelectric material;
a beam comprising a first end attached to the first actuator, a second end attached to the second actuator, and a suspended section between the first end and the second end;
a metal channel attached to the suspended section of the beam;
a source terminal extending over the beam; and
a drain terminal extending over the beam,
wherein the first actuator and the second actuator are each configured to generate piezoelectric stress when an actuation voltage is applied between the body terminal and the gate terminal, and
wherein the beam is configured for one or more structural modifications in response to the piezoelectric stress to modify one or more distances from the metal channel to the source terminal and the drain terminal.

2. The apparatus of claim 1, wherein each of the first body electrode, the second body electrode, the first gate electrode, and the second gate electrode comprises a conductive material.

3. The apparatus of claim 1, wherein the beam comprises a single layer of a third piezoelectric material.

4. The apparatus of claim 3, wherein each of the first, second, and third piezoelectric materials comprises one or more of aluminum nitride (AlN), a lead titanate compound, lead zirconate titanate (PZT), lead magnesium niobate-lead titanate (PMNT), zinc oxide (ZnO), lithium niobate (LiNbO3), lithium tantalate (LiTaO3), gallium arsenide (GaAs), gallium nitride (GaN), a III-V compound, or a II-VI compound.

5. The apparatus of claim 1, wherein the beam is configured for one or more structural modifications comprises the beam is configured for buckling towards the source terminal and the drain terminal to decrease the one or more distances from the metal channel to the source terminal and the drain terminal to form a conductive channel through the metal channel between the source terminal and the drain terminal.

6. The apparatus of claim 1, wherein the beam is configured for one or more structural modifications comprises the beam is configured for buckling away from the source terminal and the drain terminal to increase the one or more distances from the metal channel to the source terminal and the drain terminal to remove a conductive channel formed through the metal channel between the source terminal and the drain terminal.

7. The apparatus of claim 1, wherein the beam has a residual stress that at least partly determines a value of the actuation voltage required to modify the one or more distances from the metal channel to the source terminal and the drain terminal.

8. The apparatus of claim 1, wherein the beam has a length that at least partly determines a value of the actuation voltage required to modify the one or more distances from the metal channel to the source terminal and the drain terminal.

9. The apparatus of claim 1, wherein the beam has a thickness that at least partly determines a value of the actuation voltage required to modify the one or more distances from the metal channel to the source terminal and the drain terminal.

10. An apparatus, comprising:

a body terminal comprising a first body electrode and a second body electrode, with each of the first body electrode and the second body electrode comprising platinum;

a gate terminal comprising a first gate electrode and a second gate electrode, with each of the first gate electrode and the second gate electrode comprising platinum;

a first actuator between the first body electrode and the first gate electrode, the first actuator comprising aluminum nitride;

a second actuator between the second body electrode and the second gate electrode, the second actuator comprising aluminum nitride;

a beam comprising a first end attached to the first actuator, a second end attached to the second actuator, and a suspended section between the first end and the second end, with the beam comprising aluminum nitride;

a metal channel attached to the suspended section of the beam, with the metal channel comprising platinum;

a source terminal extending over the beam at a first distance of approximately 70 nm from the beam, with the source terminal comprising platinum; and a drain terminal extending over the beam at a second distance of approximately 70 nm from the beam, with the drain terminal comprising platinum, wherein the first actuator and the second actuator are each configured to generate piezoelectric stress when an actuation voltage is applied between the body terminal and the gate terminal, and wherein the beam is configured for one or more structural modifications in response to the piezoelectric stress to modify the first distance from the metal channel to the source terminal and the second distance from the metal channel to the drain terminal.

* * * * *